(12) United States Patent
Hirose et al.

(10) Patent No.: US 7,642,633 B2
(45) Date of Patent: Jan. 5, 2010

(54) SEMICONDUCTOR DEVICE INCLUDING CAPSULE TYPE SEMICONDUCTOR PACKAGE AND SEMICONDUCTOR CHIP IN STACKING MANNER

(75) Inventors: Tetsuya Hirose, Nagano (JP); Naoyuki Shinonaga, Nagano (JP); Shuichi Osaka, Nagano (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 11/347,292

(22) Filed: Feb. 6, 2006

(65) Prior Publication Data

US 2006/0175715 A1    Aug. 10, 2006

(30) Foreign Application Priority Data

Feb. 7, 2005    (JP) .............................. 2005-030853

(51) Int. Cl.
  *H01L 23/02* (2006.01)
(52) U.S. Cl. .............................. 257/686; 257/E25.013; 257/685; 257/723; 257/724
(58) Field of Classification Search ................. 257/787, 257/E25.03, E23.092, E23.126, 684–686, 257/723, 778, 777, E25.013, E25.023
See application file for complete search history.

(56) References Cited

U.S. PATENT DOCUMENTS

| | | | | |
|---|---|---|---|---|
| 5,650,967 A | * | 7/1997 | Seibert | 365/185.33 |
| 5,854,507 A | * | 12/1998 | Miremadi et al. | 257/686 |
| 6,184,587 B1 | * | 2/2001 | Khandros et al. | 257/784 |
| 6,607,937 B1 | * | 8/2003 | Corisis | 438/108 |
| 6,946,323 B1 | * | 9/2005 | Heo | 438/109 |
| 7,061,088 B2 | * | 6/2006 | Karnezos | 257/686 |
| 7,109,576 B2 | * | 9/2006 | Bolken et al. | 257/686 |
| 2002/0140085 A1 | * | 10/2002 | Lee et al. | 257/724 |
| 2004/0089955 A1 | * | 5/2004 | Zhou | 257/787 |
| 2004/0113254 A1 | * | 6/2004 | Karnezos | 257/686 |
| 2004/0183180 A1 | * | 9/2004 | Chung et al. | 257/686 |

(Continued)

FOREIGN PATENT DOCUMENTS

JP       2002-217367       8/2002

(Continued)

*Primary Examiner*—Chris C Chu
(74) *Attorney, Agent, or Firm*—McDermott Will & Emery LLP

(57) ABSTRACT

An interposer substrate having electrodes on the front surface and on the rear surface thereof, respectively, is prepared, and at least one memory chip having electrodes connected to an internal circuit is prepared. Then, the rear surface of the memory chip is bonded to the front surface of the interposer substrate, and the memory chip is sealed to the front surface of the interposer substrate to constitute an encapsulated capsule type semiconductor package. On the other hand, a logic chip is prepared. Further, a main substrate is prepared in which electrodes are formed on the front surface and on the rear surface, respectively, and desired internal connections are provided between these electrodes. Then, the capsule type semiconductor package and the logic chip are laminated on the main substrate, and desired connections are provided between the electrodes on the rear surface of the interposer substrate of the capsule type semiconductor package, the electrodes of the logic chip and the electrodes on the front surface of the main substrate. The capsule type semiconductor package and the logic chip are sealed to the front surface of the main substrate by a resin to obtain a system-in-package type semiconductor device.

9 Claims, 8 Drawing Sheets

U.S. PATENT DOCUMENTS

| | | | |
|---|---|---|---|
| 2005/0104183 A1* | 5/2005 | Kuroda et al. | 257/686 |
| 2005/0139979 A1* | 6/2005 | Tao et al. | 257/686 |
| 2005/0167827 A1* | 8/2005 | Hayashi | 257/734 |
| 2006/0199915 A1* | 9/2006 | Izumi et al. | 525/301 |

FOREIGN PATENT DOCUMENTS

| | | |
|---|---|---|
| JP | 2002-231885 | 8/2002 |

* cited by examiner

SEMICONDUCTOR DEVICE INCLUDING CAPSULE TYPE SEMICONDUCTOR PACKAGE AND SEMICONDUCTOR CHIP IN STACKING MANNER

BACKGROUND OF THE INVENTION

1. Field of the Invention

The present invention relates to a system-in-package type semiconductor device incorporating a capsule type semiconductor package.

2. Related Art

For purposes of functional improvement, downsizing and system development of a conventional semiconductor device, a multi-chip package is employed particularly for a memory product type, in which multiple IC chips are perpendicularly laminated and this laminated stack is directly mounted on an interposer substrate using wire bonding. (see for example, Japanese Unexamined Patent Publication No. 2002-231885, and Japanese Unexamined Patent Publication No. 2002-217367).

According to the conventional technological method as above, test of electric characteristics is conducted after completion of assembly of multiple chips, so that defective products are sometimes found later, and a reduction in their manufacturing costs is difficult. Furthermore, the internal arrangement of wiring is not much free and a multi-layer interposer substrate is required. This results in increases in substrate costs and package size, and the package becomes bulky.

The present invention has been made to solve these problems. According to the present invention, a capsule type semiconductor package, that has been tested and encapsulated in advance, is connected to another semiconductor chip such as a functioning logic chip. As a result, chips having different functions can be combined to cooperate with each other, and system development can be easily accomplished.

SUMMARY OF THE INVENTION

According to one aspect of the present invention, a semiconductor device comprises a capsule type semiconductor package and a logic chip in combination and sealed on a main substrate.

The capsule type semiconductor package includes at least one memory chip sealed on an interposer substrate. The interposer substrate has electrodes on a first primary surface and a second primary surface opposing to one another, and also has desired internal electrical connections provided between the electrodes of both primary surfaces. The memory chip has electrodes formed on a front surface thereof and is laminated on the first primary surface of the interposer substrate, and the electrodes of the memory chip are connected to the electrodes on the first primary surface of the interposer substrate. The memory chip and the inter-electrode connections are sealed to the first primary surface of the interposer substrate by a resin.

The logic chip has electrodes on a front surface thereof. The main substrate has electrodes provided on a first primary surface and a second primary surface opposing to each other, and has desired internal electrical connections between the electrodes of both primary surfaces.

The capsule type semiconductor package and the logic chip are laminated on the first primary surface of the main substrate, and desired electrical connections are provided among the electrodes on the second primary surface of the interposer substrate of the capsule type semiconductor package, the electrodes of the logic chip and the electrodes on the first primary surface of the main substrate.

Further, the capsule type semiconductor package, the logic chip and the inter-electrode connections are sealed to the first primary surface of the main substrate by a sealing resin.

According to the present invention, a capsule type semiconductor package, wherein a memory chip is comprised, that has been tested and encapsulated in advance, is connected to another semiconductor chip, such as a functioning logic chip. As a result, chips having different functions can be combined to cooperate with each other, and accordingly, system development can be easily accomplished.

Further, a capsule type semiconductor package is employed that has been preliminarily inspected and encapsulated in advance. If a semiconductor package is not tested in advance and found defective later, another combined semiconductor chip would not be effectively used, even when the combined chip itself proved to be non-defective. By use of a capsule type semiconductor package according to the present invention, occurrence of such kind of associated defects would be prevented. This, in turn, would minimize testing load and prevent manufacturing losses.

In addition, since a capsule type semiconductor package is employed instead of a bare chip, the wirings, testing and handling are simplified, and the selection of defective or non-defective products gets easy.

Other and further objects, features and advantages of the invention will appear more fully from the following description.

BRIEF DESCRIPTION OF THE DRAWINGS

FIGS. 3 through 12 are cross-sectional views or plan views respectively for explaining the individual steps of the manufacturing process of the system-in-package semiconductor device according to the first embodiment, in which FIG. 5 is a plan view corresponding to FIG. 4, and FIG. 12 is a plan view corresponding to FIG. 11.

DESCRIPTION OF THE PREFERRED EMBODIMENTS

Figure 1:
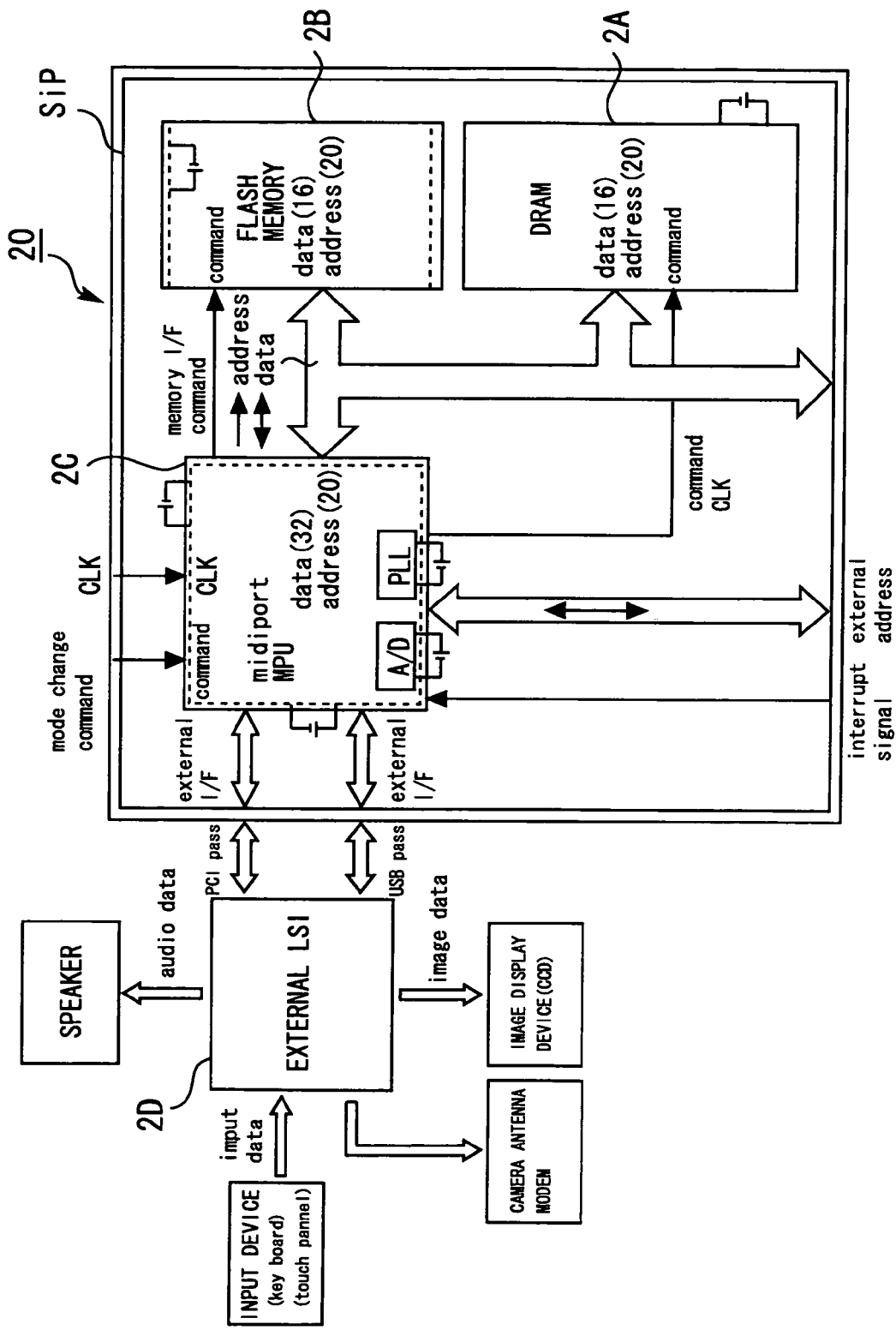
FIG. 1 is a diagram showing an example of the system configuration of a system-in-package type semiconductor device according to a first embodiment of the present invention.

The preferred embodiments of the present invention will now be described herein below with reference to the accompanying drawings. Note that, in the individual drawings, the same or corresponding elements are denoted by the same reference numerals and the explanation thereof may be simplified or omitted.

First Embodiment

FIG. 1 is a diagram showing an example of the system configuration of a system-in-package type semiconductor device according to a first embodiment of the present invention. Included in the system-in-package semiconductor device 20 in FIG. 1 are memory chips 2A and 2B and a logic chip 2C. In this embodiment, a system-in-package semiconductor device 20 will be described in which a logic chip and memory chips are incorporated, and the memory chips are previously encapsulated in a semiconductor package.

In this embodiment, the semiconductor device 20 incorporates, as memory chips, the memory chip 2A in which a DRAM is formed and the memory chip 2B in which a nonvolatile memory such as a flash memory is formed. Note, however, that the number and types of memory chips that may be used are not limited to those shown in this example.

The main functions of the logic chip is, for example, to perform digital signal operations using an MPU (a Micro Processing Unit) and to convert logical addresses (external addresses) for an external interface into physical addresses for a flash memory or a DRAM, and to thus facilitate the exchange of data between an external LSI (2D) provided outside the system and the memory chips 2A and 2B provided inside the system. The functions of the logic chip, however, are not limited to the above-mentioned functions.

The main function of the flash memory is to store, read out and write in external data such as image data and audio data by utilizing the property of a nonvolatile memory. The function of the flash memory, however, is not limited to the above-mentioned functions. Further, the memory type used for the nonvolatile memory is not limited to a flash memory, but a ferroelectric memory, a magnetic memory or a phase-change memory can also be employed for example. In addition, a nonvolatile memory chip integrates therein nonvolatile memories having a large memory capacity, and thus the memory capacity of the nonvolatile memory chip per se is larger than that of a nonvolatile memory formed on a logic chip.

The main function of DRAM is to serve as a cache memory to provide temporary storage for programs or for data used by a logic chip owing to its random access characteristics and short access time. The functions provided by DRAM, however, are not limited to the above ones. Further, the memory type used for the cache memory chip is not limited to DRAM, but SRAM and pseudo SRAM may also be employed for example. It is preferred that the cache memory chip has short access time. A cache memory chip having shorter access time than the above-described nonvolatile memory chip is further preferred. In addition, the cache memory chip integrates therein cache memories having a large memory capacity, and thus the memory capacity of the cache memory chip is larger than that of a cache memory formed on a logic chip for example.

Compared with a logic chip that incorporates therein a logic circuit as its primary component or constituent, a memory chip that incorporates therein as its primary components memory cells such as DRAM and flash memory tends to be at a low yield. In the case of a memory chip in which individual memory cells are independently operated as information storage components, each memory cell must meet certain performance requirements in order to satisfy the need for a high level of reliability in the storage of information. In case of DRAM, an increase in a leak current between the source and the drain might deteriorate the refresh characteristic of DRAM. In case of flash memory, a leak current resulting from a carrier trap produced by an oxide film tunnel might deteriorate the written data holding characteristic. Unless these problems are overcome for individual memory cells, reliability in storage performance is not ensured for the maintenance of information held in a memory. In a memory chip, a very large number of memory cells are formed at high density and all these memory cells should exhibit reliable information holding characteristics. Thus, the memory chips must pass burn-in testing, i.e. accelerated testing, and hot and cold temperature testing before finally being regarded as a good, serviceable product and shipped. Thus, the defective product ratio increases through these testing and selection processes.

On the other hand, the logic chip is formed by relatively simple structure such as CMOS and wiring in a simple case, rather than a complicated device structure such as capacitors used in DRAMs or a lamination structure of the floating gates and control gates in flash memories. Further, the operation circuit will suffice as a primary component of a microprocessor unit by having a function required to the operation circuit as a whole. Therefore, unlike a memory chip, the testing of electric characteristics including time transient characteristics of the individual elements in a logic chip will not be much performed. Exceptionally, there is a logic chip wherein memory cells are internally provided as in a flash memory. However, in such a case, the main function of the memory cells is to store a program for the operation of the logic chip. Therefore, the memory capacity of the included memory cells is small and the frequency of actual rewriting is also small compared with the memory cells whose main functions are to store and to rewrite external data. Thus, the defective ratio of logic chips during the selection process is lower than that of memory chips together with the differences in the selection conditions.

Figure 2:
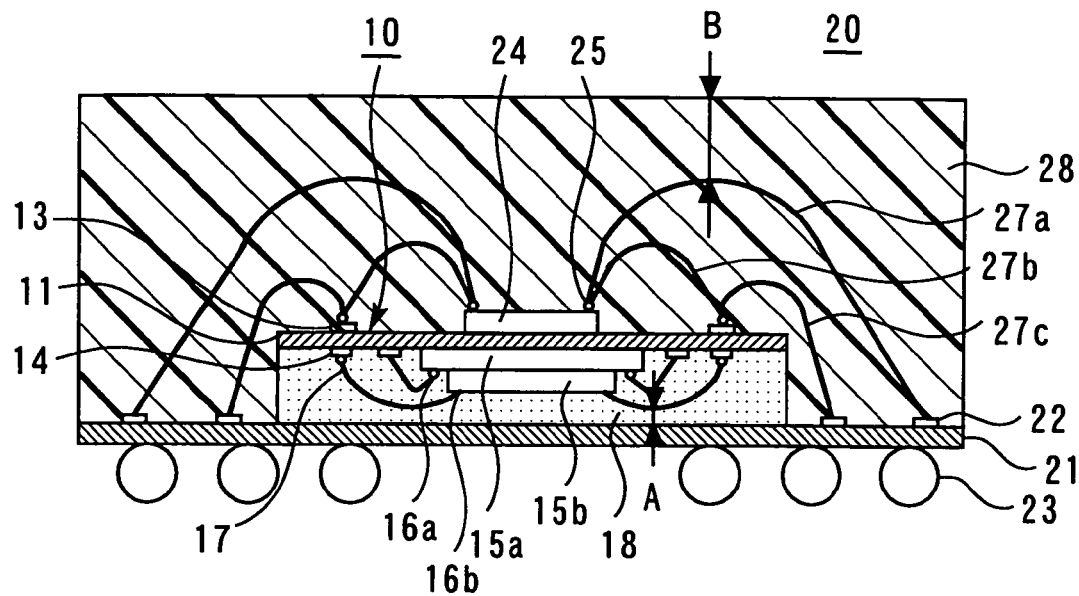
FIG. 2 is a cross-sectional view of the complete system-in-package semiconductor device according to the first embodiment.

FIG. 2 is a cross-sectional view of the complete system-in-package semiconductor device according to this embodiment. In the system-in-package device 20 of this embodiment, a capsule type semiconductor package 10 is mounted on a main substrate 21. Specifically, the capsule type semiconductor package 10, for which electrodes 13 are formed on the rear surface of an interposer substrate 11, is mounted onto the main substrate 21 in a manner such that the electrodes 13 are directed upward. A flash memory chip 15a and a DRAM chip 15b are also laminated and stored inside the capsule type semiconductor package 10.

A structure of the capsule type semiconductor package 10 will now be described below.

In the capsule type semiconductor package 10, a plurality of electrodes 13 for electric connections to the exterior are arranged on the rear surface, i.e. a second primary surface, of the interposer substrate 11 (hereinafter simply referred to as a substrate, as required), and a plurality of electrodes 14 for electric internal connections are arranged on the front surface, i.e. a first primary surface, opposite to the second primary surface. The electrodes 14 are used for internal electric connections and are internally connected to desired one or ones of the electrodes 13 for electric connection ns to the exterior.

The rear surface of the flash memory chip 15a is mounted on the front surface of the substrate 11, and a plurality of surface electrodes 16a are formed on the surface of the flash memory chip 15a and are connected to the internal circuit of the flash memory chip 15a. An adhesive layer may be used to adhere the substrate 11 and the flash memory chip 15a to each other. The surface electrodes 16a on the flash memory chip 15a are further connected, by bonding wires 17a, to desired one or ones of the electrodes 14 formed on the substrate 11 for electric internal connections.

The rear surface of the DRAM chip 15b is laminated with the front surface of the flash memory chip 15a, and a plurality of electrodes 16b for electric internal connections are formed on the front surface of the DRAM chip 15b. An adhesive layer may be used to adhere the flash memory chip 15a with the DRAM chip 15b. The surface electrodes 16b on the DRAM chip 15b are electrically connected, by bonding wires 17b, to desired one or ones of the electrodes 14 on the substrate 11 for electric internal connections.

The flash memory chip 15a, the DRAM chip 15b and the bonding wires 17a and 17b are sealed, on the rear surface of the substrate 11, by a capsule sealing material 18.

The components called electrodes here are those that are generally formed of conductive thin film and provided as wiring pads or bonding pads. Further, the material called the sealing member is generally a sealing resin.

As described above, the surface electrodes 16a and 16b formed on the flash memory chip 15a and the DRAM chip 15b are connected as desired by way of the bonding wires 17a and 17b to the electrodes 14 of the substrate 11 for electric internal connections, so that the flash memory chip 15a and the DRAM chip 15b are permitted to perform a predetermined operation via the electrodes 13 of the substrate 11 for electric connection to the exterior.

As described above, the capsule type semiconductor package 10 is formed by mounting the memory chips 15a and 15b on the substrate 11, and by encapsulating the entire by resin sealing. Thus, the size of the substrate 11 may be reduced to a size almost as small as the sizes of the memory chips 15a and 15b, and the capsule sealing resin 18 is formed as thin as possible and is same size with the substrate 11. As a result, the entire size is formed as close as to the size of the system in package (SiP). The present inventors named this package "a chip capsule" or "a chip size capsule".

Next, on the rear surface of the interposer substrate 11, a logic chip 24 is mounted with the primary surface and electrodes 25 thereon directed upward. The electrodes 25 formed on the logic chip 24 are electrically connected, via bonding wires 27a, to electrodes 22 formed on the rear surface of the main substrate 21. Further, the electrodes 25 on the logic chip 24 are also electrically connected, via bonding wires 27b, to the electrodes 13 on the rear surface of the interposer substrate 11. On the front surface of the main substrate 21, the electrodes 23 are formed for electric connections to the exterior, and are electrically connected internally as desired to the electrodes 22 on the rear surface thereof.

Bonding wires 27c, which connect the electrodes 13 on the rear surface of the interposer substrate 11 to the electrodes 22 on the main substrate 21, are electrically connected, for example, to electrodes for a power voltage supply to the memory chip inside the capsule. The bonding wires 27a, which connect the electrodes 25 on the logic chip 24 to the electrodes 22 on the main substrate 21, are electrically connected, for example, to the interface external electrodes or power supply electrodes for the logic chip 24. The bonding wires 27b, which connect the electrodes 25 on the logic chip 24 to the electrodes 13 on the rear surface of the interposer substrate 11, is electrically connected, for example, to the memory interface electrodes for the logic chip 24.

In this embodiment, the bonding wires 27b are employed for electrically connecting the electrodes 25 on the logic chip 24 to the electrodes 13 on the rear surface of the interposer substrate 11, so that the electric inductance of wiring that forms a memory bus can be reduced. This is effective for fast data input/output between the logic chip 24 and the cache memory chip. In addition, by use of the electrodes and internal wirings of the interposer substrate 11, the data wirings or address wirings corresponding between the memory chips 15a and 15b can be electrically connected through common wirings, and can also be electrically connected to the substrate electrodes corresponding to the data electrodes of the logic chip 24. As a result, the wiring layout is easily arranged.

Further, the capsule sealing resin 18 is provided on the interposer substrate 11 in order to mainly protect the memory chips 15a and 15b and the bonding wires 17a and 17b connected thereto during the burn-in process and the testing process for the capsule type semiconductor package 10, which will be described later. A package sealing resin 28 is provided on the main substrate 21 in order to internally protect the system-in-package semiconductor product 20 from the external environment when the device 20 is brought into practical use. Comparing the functions of the capsule sealing resin 18 and the package sealing resin 28, the package sealing resin 28 is exposed to a more severe environmental condition, and the interior protection function is highly requested for the package sealing resin 28. Therefore, in this embodiment, it is preferable that the thickness (B) of the package sealing resin 28 formed on its wire loops be greater than the thickness (A) of the capsule sealing resin 18 formed on its wire loops. For example, in this embodiment, the thickness (B) of the package sealing resin 28 formed on the wire loops is 100 μm, while the thickness (A) of the capsule sealing resin 18 formed on the wire loops is 50 μm.

Further, it is preferable that the thermal expansion coefficient of the capsule sealing resin 18 be equal to or smaller than the thermal expansion coefficient of the package sealing resin 28 in order to prevent cracking of the package sealing resin 28 during thermal cycles for example.

Second Embodiment

A method of manufacturing the system-in-package type semiconductor device according to the present invention will now be described. FIGS. 3 through 12 are cross-sectional views respectively for explaining the individual steps of the manufacturing process. In this embodiment, the manufacturing process is disclosed by employing a multi-layered substrate having areas in which a plurality of capsule type semiconductor packages may be formed.

Figure 3:
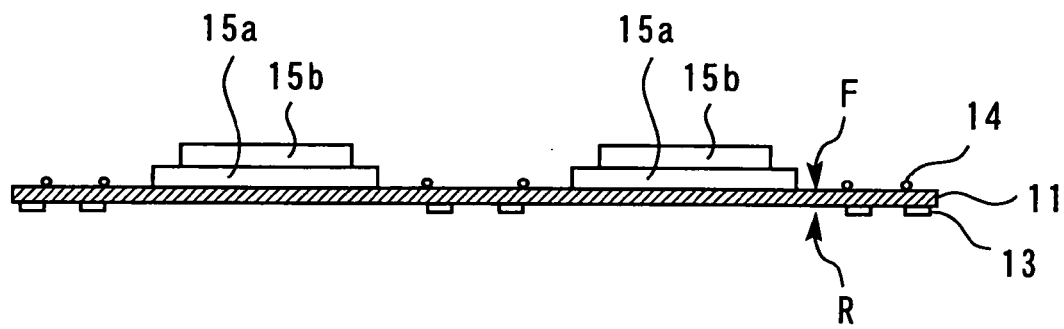
Figure 4:
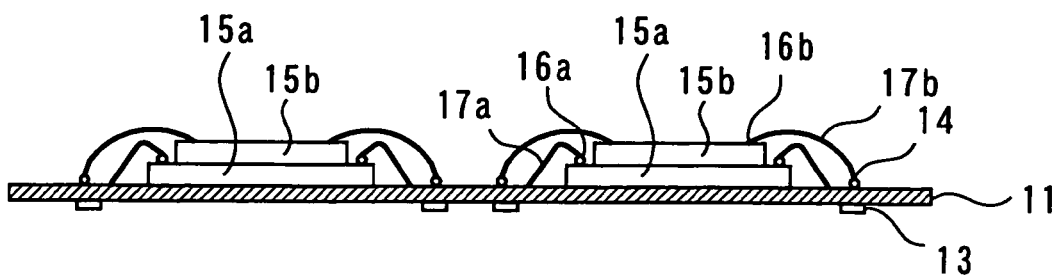
Figure 5:
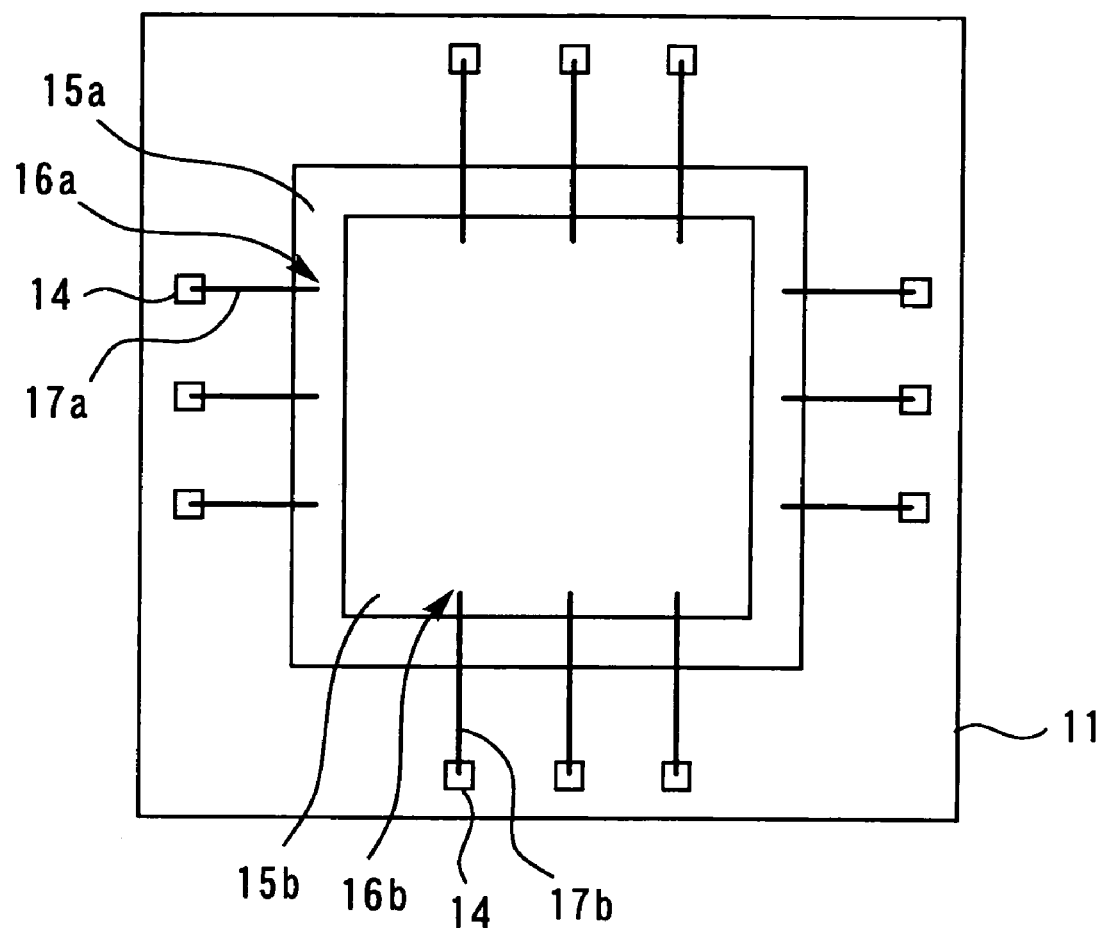

Referring to FIG. 3, flash memory chips 15a and DRAM chips 15b are adhered and fixed to an interposer substrate 11 using an adhesive. In the interposer substrate 11, desired internal electrical connections are provided between electrodes 13 on the rear surface (second primary surface, indicated by an arrow "R" in FIG. 3) and electrodes 14 on the front surface (the first primary surface, indicated by an arrow "F" in FIG. 3), Referring to FIGS. 4 and 5, the memory chips 15a and 15b are electrically connected, by bonding wires, to the electrodes 14 on the interposer substrate 11. Specifically, electrodes 16a on the flash memory chips 15a are connected to the electrodes 14 on the interposer substrate 11 by bonding wires 17a. Electrodes 16b on the DRAM chips 15b are electrically connected to the electrodes 14 on the interposer substrate 11 by bonding wires 17b.

For the DRAM chips 15b laminated on the flash memory chips 15a, a first bonding is carried out to the electrodes 14 on the interposer substrate 11, and then a second bonding is done to the chip electrodes 16b. This is a reverse-way bonding and this reduces the loop height of the bonding wires 17b formed on the DRAM chips 15b. This is preferable because then the thickness of the entire capsule type semiconductor package 10 can be reduced.

In the drawings, only a small number of the electrodes formed on the individual chips and a small number of the bonding wires are shown for the simplicity's sake. However, in this embodiment, sixteen data pins, twenty address pins, ten command pins, two power supply potentials (Vcc) and two ground potentials (GND), for example, are provided for the flash memory chip 15a. Further, thirty-two data pins, fourteen address pins, eight command pins, eight power supply potentials (Vdd and VddQ) and eight ground potentials (GND) are provided for the DRAM chip 15b.

Furthermore, in this embodiment, some of the data pins of the flash memory chips 15a and some of the data pins of the DRAM chip 15b are used in common by wiring formed on the interposer substrate 11, and are connected to the common electrodes formed on the rear surface of the interposer substrate 11. Similarly, some of the address pins of the flash memory chip 15a and some of the address pins of the DRAM chip 15b are electrically connected to the common electrodes through wiring in the interposer substrate 11 in order to be connected to a common bus.

In this embodiment, however, the arrangement is not limited to the above. For example, when address information in the flash memory is for a serial transfer, the address pins of the flash memory may not be connected in common with the address bus of the DRAM but connected to separate electrodes.

Figure 6:
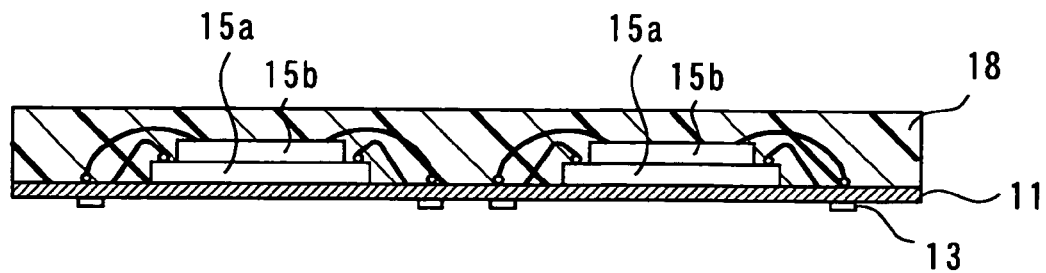

Referring to FIG. 6, after completion of the connection process using the bonding wires, the structure is sealed using a capsule sealing resin 18.

Figure 7:
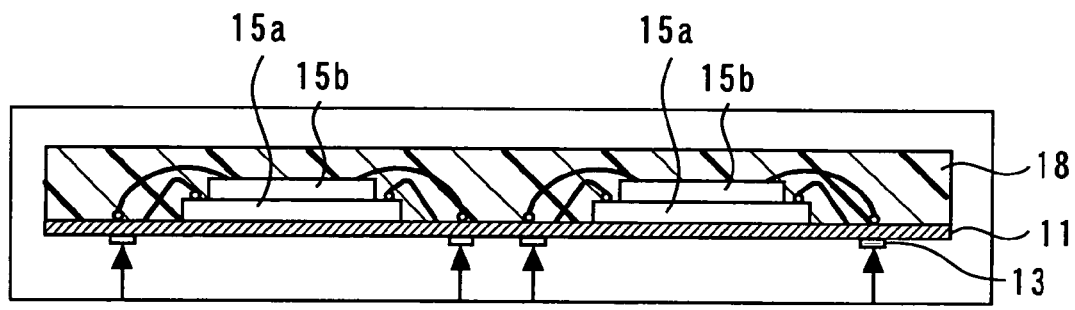

Referring to FIG. 7, after the sealing process has been completed, the burn-in process and the electric characteristic inspections are performed. During the burn-in process, the internal circuit is operated while being subjected to heat cycle, and the occurrence of an initial failure of a memory chip is accelerated in order to prevent the initial failure after shipping. In this embodiment, for example, while the internal circuit of each memory chip is being operated, the accelerated test is performed during the cyclical application of temperatures ranging from −30° C. to 130° C.

Furthermore, in this embodiment, during the burn-in process, the flash memory chip and the DRAM chip are operated at the same time while being subjected to heat cycles, so that a plurality of types of memory chips integrated in a single capsule can simultaneously be tested by a single burn-in apparatus. In this manner, since the burn-in test is performed in parallel for a plurality of types of memory chips, productivity of the semiconductor device in the manufacturing processing is improved.

After the burn-in process has been completed, testing of the electric characteristics is in turn performed. Thus, the quality determination of the encapsulated semiconductor devices is completed.

In addition, during or following the burn-in process, test of the electric characteristics may also be performed in the same burn-in apparatus. The burn-in process and the electric characteristic testing may be performed for a plurality of memory chips formed on one substrate before divided in pieces. Thus, the productivity is very much improved.

Figure 8:
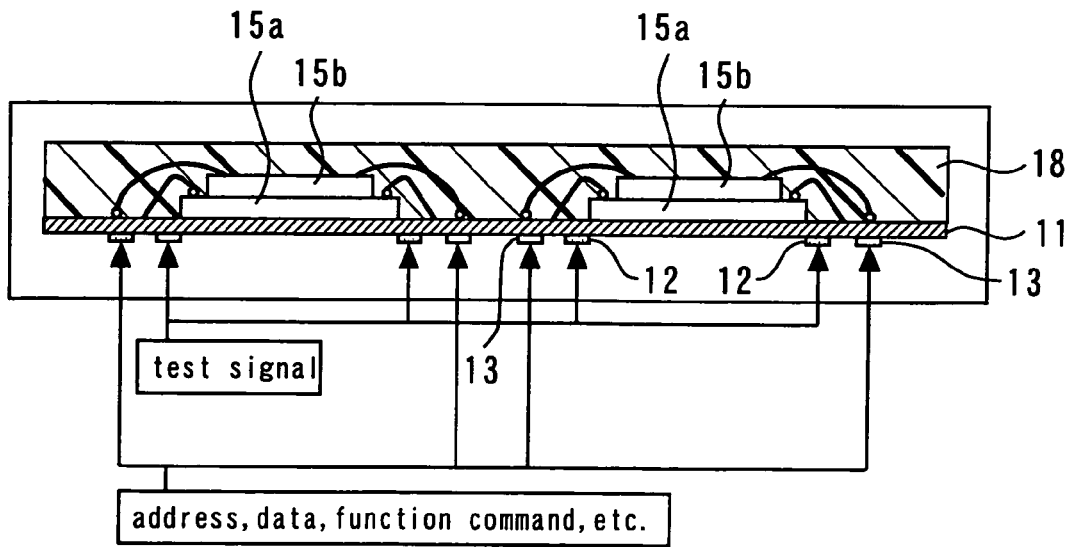

Referring to FIG. 8, test terminals 12 may be provided on the rear surface of the interposer substrate 11. The test terminals 12 are used to enter a test signal or a burn-in signal to specific terminals that are used only for the testing or the burn-in process. More precisely, the test terminals 12 are used to enter an instruction to set a test mode during the testing process (the electric characteristic inspection process), or are used to enter an instruction to set a burn-in mode during the burn-in process.

The desired connections are provided, by bonding wires 17a and 17b, between the electrodes 16a/16b of the memory chips 15a/15b and the electrodes 14 of the interposer substrate 11. Further, desired internal connections are provided between the electrodes 14 and the test terminals 12 of the interposer substrate 11. Thus, a predetermined operation for the memory chips 15a and 15b can be externally tested via the test terminals 12 of the interposer substrate 11.

Figure 9:
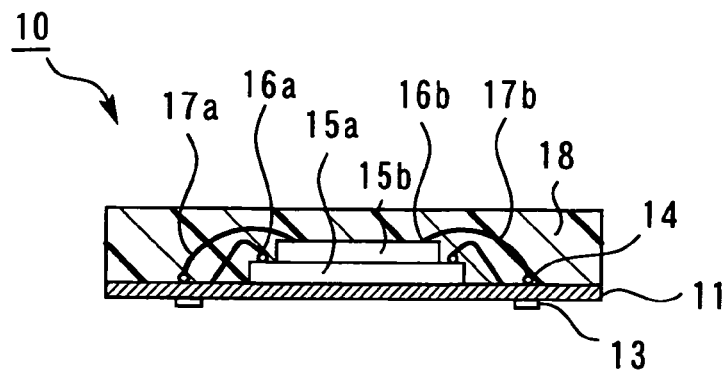

Referring to FIG. 9, after completion of the burn-in process and the electric characteristic inspection, the entire structure is divided by cutting the capsule sealing resin 18 and the interposer substrate 11 using a dicing blade, and a plurality of encapsulated capsule type semiconductor packages 10 are obtained.

As described above, according to the capsule type semiconductor package 10 of this embodiment, a nonvolatile semiconductor memory chip, such as the flash memory chip 15a, is bonded to the front surface of the interposer substrate 11. A volatile semiconductor memory chip, such as the DRAM chip 15b, is bonded to the nonvolatile semiconductor memory chip. The electrodes 16a and 16b of the memory chips are electrically connected to the electrodes 14 on the front surface of the interposer substrate 11. Further, both memory chips and the bonding wires are sealed with the interposer substrate using a resin. Thus, the sealing resin 18 has a thickness slightly greater than the height of the lamination of the chips 15a and 15b, and dimensionally, has the same size as the interposer substrate 11 and is cast in a size as small as possible. On the whole, the sealing resin 18 is shaped so that its size is close to that of the chip.

Figure 10:
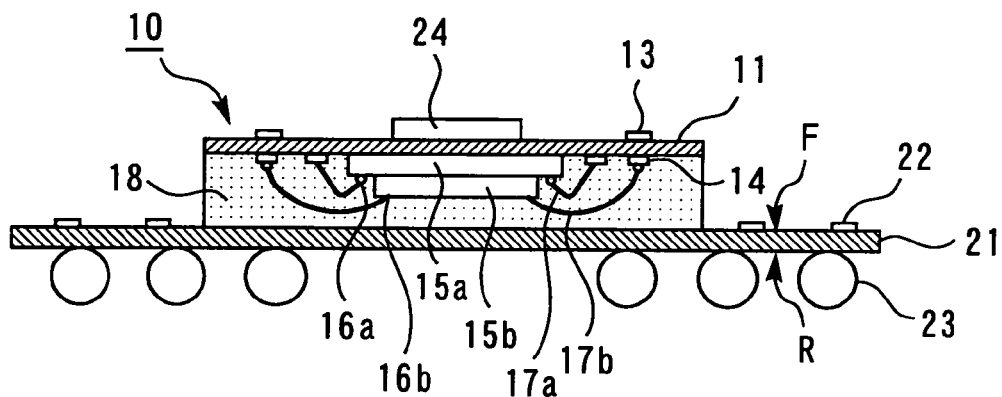

Next, referring to FIG. 10, the capsule type semiconductor package 10 is bonded by an adhesive to the front surface of the main substrate 21 in such a manner that the capsule sealing resin 18 of the package 10 is surfaced to the front surface of the main substrate 21. Further, a logic chip 24 is bonded and fixed, using an adhesive, to the rear surface of the interposer substrate 11 of the capsule type semiconductor package 10. According to this embodiment, the memory chips 15a and 15b have a large memory capacity, and their chip sizes are greater than that of the logic chip 24, so that the size of the interposer substrate 11 is greater than that of the logic chip 24. Therefore, it is preferable that the logic chip 24 is laminated on the rear surface of the interposer substrate 11. On the front surface of the main substrate 21, i.e. the first primary surface (indicated by an arrow "F" in FIG. 10), electrodes 22 are formed, while electrodes 23 are formed on the rear surface, i.e. the second primary surface (indicated by an arrow "R" in FIG. 10), and desired internal electrical connections are provided between the electrodes 22 and 23.

Figure 11:
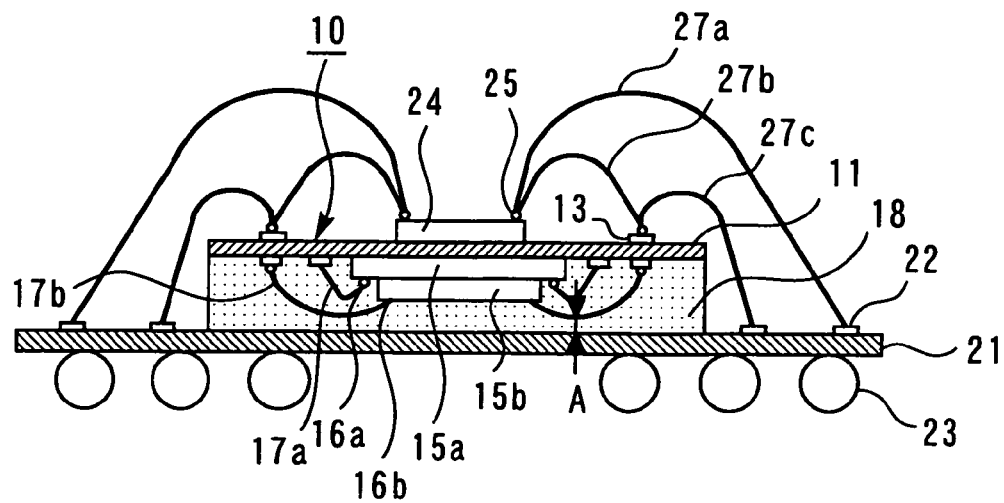
Figure 12:
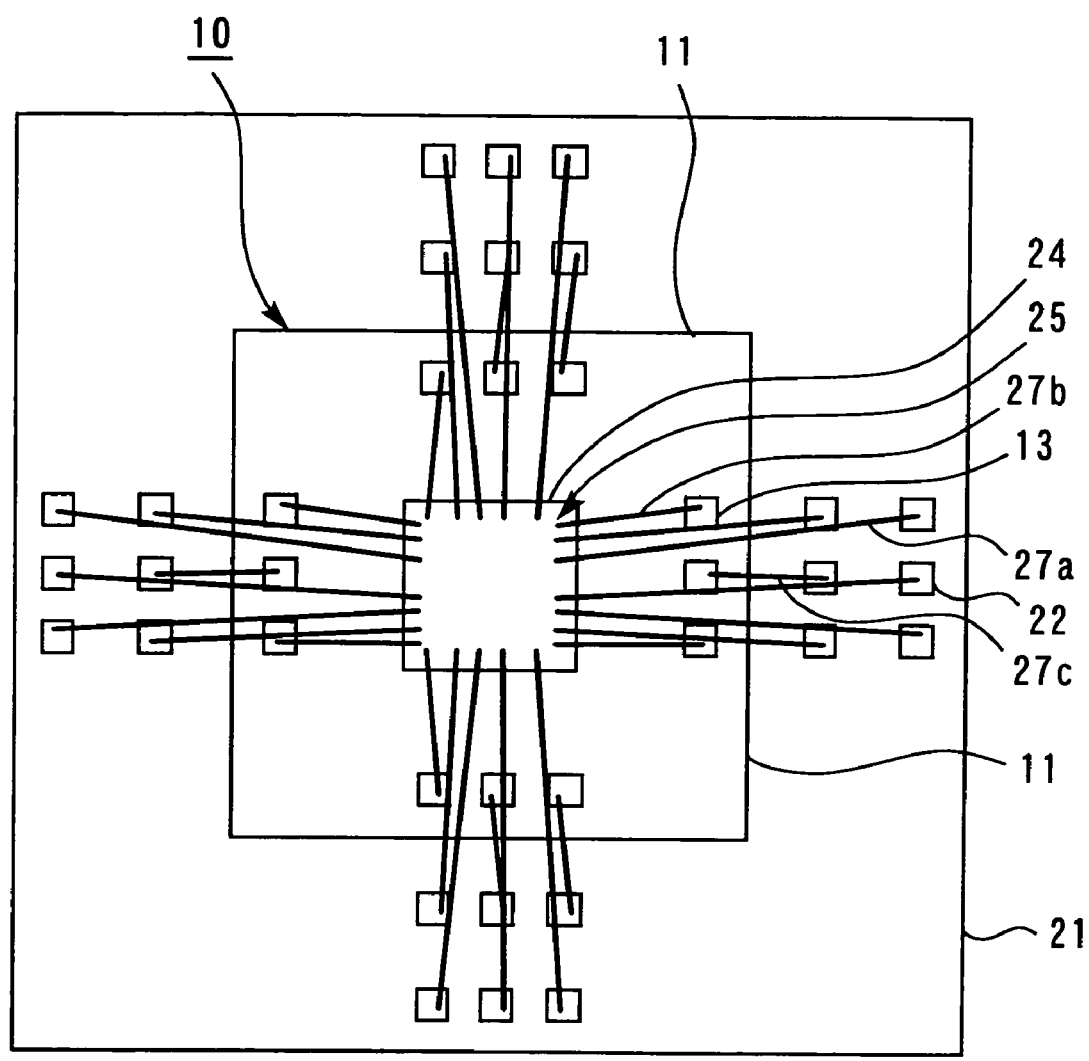

Referring to FIGS. 11 and 12, electrodes 25 of the logic chip 24 and the electrodes 22 on the main substrate 21 are connected by bonding wires 27a, and the electrodes 25 on the logic chip 24 and the electrodes 13 on the rear surface of the interposer substrate 11 are connected by bonding wires 27b. Further, the electrodes 13 on the rear surface of the interposer substrate 11 and the electrodes 22 on the main substrate 21 are connected by bonding wires 27c.

To simplify the illustration of the drawings, not all of the pins and wires are shown. However, in this embodiment, for example, in order to form a memory interface, thirty-two data wires and twenty address wires are employed for the connection of the logic chip 24 and the electrodes 13 on the rear surface of the interposer substrate 11, and in order to form an external interface, two-hundred external interface wires are employed for the connection of the logic chip 24 and the electrodes 22 on the main substrate 21. The wire types and the number of wires are not limited to these examples.

Referring again to FIG. 2, after completion of the wire bonding, the capsule type semiconductor package 10, the logic chip 24 and the bonding wires 27a through 27c are sealed on the main substrate 21 using the package sealing resin 28. As previously described, it is preferable that the package sealing resin 28 be formed thicker than the capsule sealing resin 18, and that a material be selected that has a thermal expansion coefficient that is equal to or greater than that of the capsule sealing resin 18.

After the sealing process, the tests of the electric characteristics are conducted, and then a plurality of system-in-package type semiconductor devices are obtained through dividing process. Generally, the yield of the logic chip is higher than the yield of the memory chips. Therefore, even when the logic chip is laminated in the bare state in the capsule type semiconductor package 10, it scarcely affect the yield of the system-in-package type semiconductor device as a whole. Furthermore, the method of this embodiment is preferable because the manufacturing costs can be reduced when compared with the method whereby the logic chip 24 is encapsulated.

Third Embodiment

Figure 13:
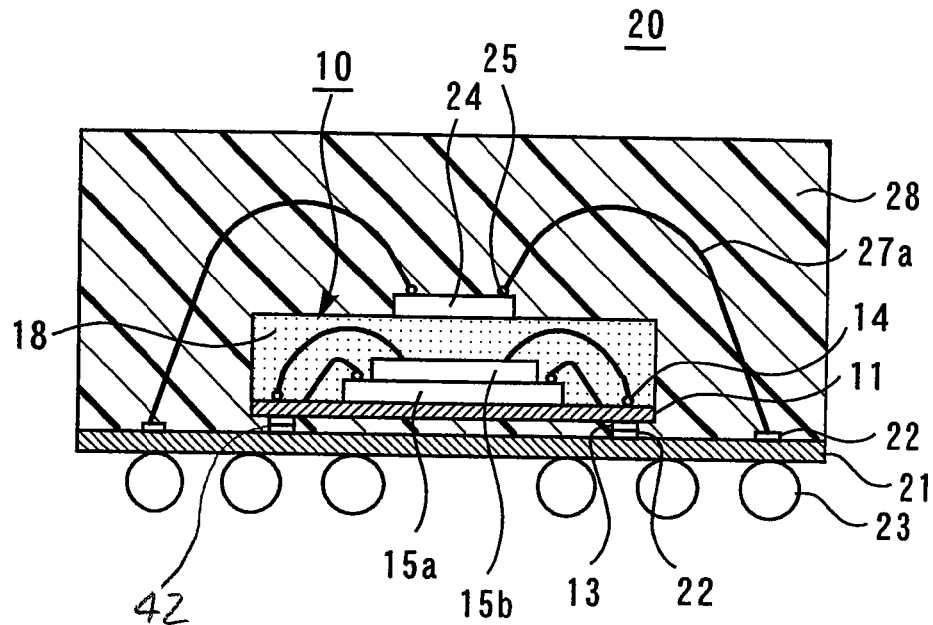
FIG. 13 shows a cross-sectional view of a system-in-package type semiconductor device according to a third embodiment of the present invention.

FIG. 13 shows a cross-sectional view of a complete system-in-package type semiconductor device according to a third embodiment of the present invention. A difference in this embodiment from the previous embodiments resides in that a capsule type semiconductor package 10 is mounted on the main substrate 21 in a opposite direction and the electrical connections to the main substrate 21 are made differently. The other parts of the structure and the manufacturing procedures are same so that the detailed explanations will be omitted.

In this embodiment, the capsule type semiconductor package 10 is mounted downward on a main substrate 21 in the way that the electrodes 13 on the rear surface of an interposer substrate 11 and the electrodes 22 on the main substrate surface 21 oppose each other. The electrodes 13 on the interposer substrate 11 are connected to the electrodes 22 on the main substrate 21 by soldering using solder 42 for example.

In this embodiment, the connection is provided between the under side of the capsule type semiconductor package 10 and the main substrate 21, the number of bonding wires formed inside package sealing resin 28 is reduced. As a result, the wire loops that connect a logic chip 24 to electrodes 22 on the main substrate 21 will not much expand laterally. Therefore, it is easier to reduce the size of the semiconductor device as a whole.

Fourth Embodiment

Figure 14:
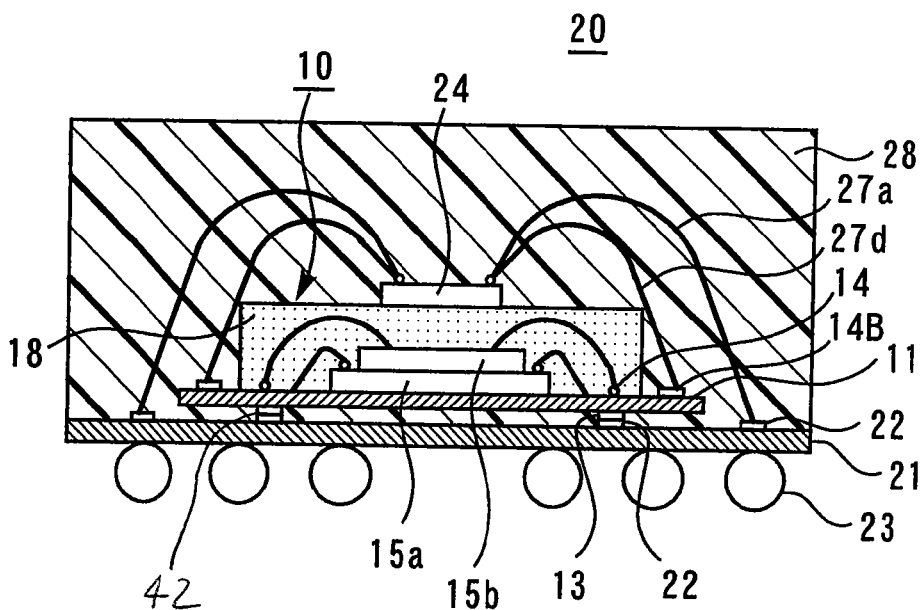
FIG. 14 is a cross-sectional view illustrating a system-in-package type semiconductor device according to a fourth embodiment of the present invention.

FIG. 14 is a cross-sectional view illustrating a system-in-package type semiconductor device according to a fourth embodiment of the present invention.

According to a capsule type semiconductor package 10 of this embodiment, electrodes 14 (i.e. first electrodes) that are to be sealed by a capsule sealing resin 18, and electrodes 14B (i.e. third electrodes) that are not to be sealed by the capsule sealing resin 18 are formed on the front surface of an interposer substrate 11, while electrodes 13 (i.e. second electrodes) are formed on the rear surface thereof. That is, the interposer substrate 11 of this embodiment is designed so that the peripheral ends of the interposer substrate 11 of the previous embodiments are externally extended from the capsule sealing resin 18, and the electrodes 14B are formed on the front surface of the extended portion. Inside the substrate 11, desired connections are provided between the electrodes 14B and other front surface electrodes 14 or the rear surface electrodes 13.

According to a system-in-package type semiconductor device 20 of this embodiment, electrodes 25 of a logic chip 24 are connected to the electrodes 14B on the front surface of the interposer substrate 11 by bonding wires 27d.

As described above, according to this embodiment, the electrodes 14B, which serve as external electrodes, are provided on the peripheral front surface of the interposer substrate 11 that are exposed, free of the capsule sealing resin 18. With this arrangement, the bonding wires for the memory interface can be connected to the interposer substrate 11 directly.

Fifth Embodiment

Figure 15:
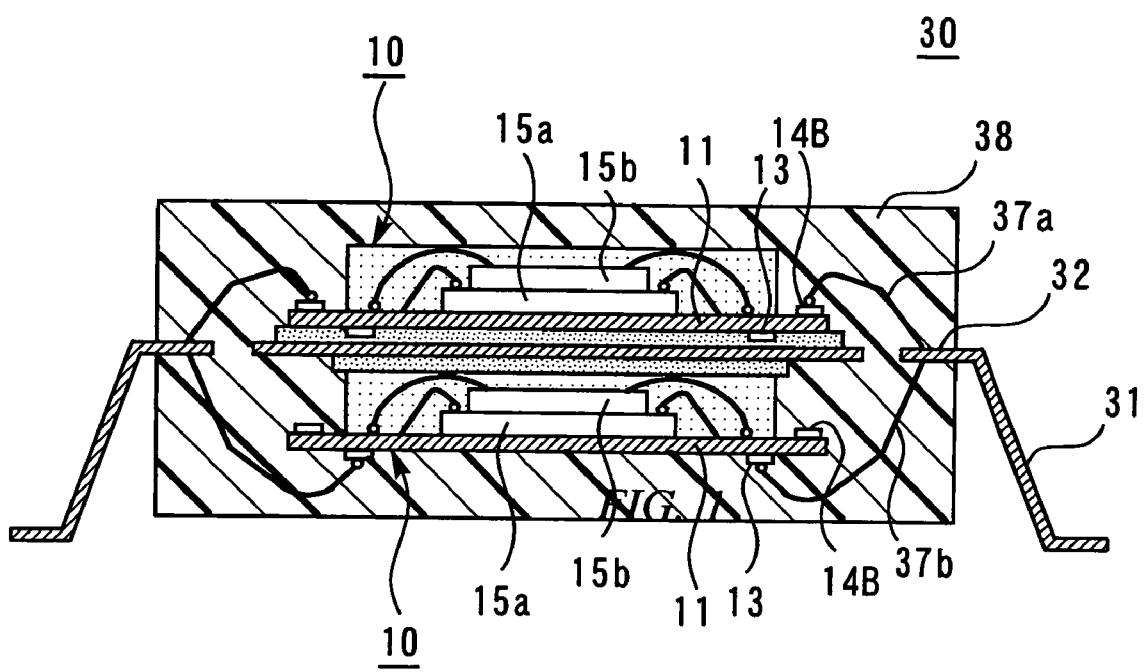
FIG. 15 shows a cross-sectional view of a system-in-package type semiconductor device according to a fifth embodiment of the present invention.

FIG. 15 shows a cross-sectional view of a system-in-package type semiconductor device according to a fifth embodiment of the present invention.

A capsule type semiconductor package disclosed in the above embodiments can be applied not only for a semiconductor device that includes a main substrate 21, but also for a semiconductor device that is connected to a lead frame 31 as shown in FIG. 15.

According to a system-in-package type semiconductor device 30 in the example shown in FIG. 15, electrodes 14B are formed on the front surface of the interposer substrate (capsule substrate) 11, and electrodes 13 are formed on the rear surface of the interposer substrate 11. Thus, the electrodes 14B on the front surface of the interposer substrate 11 of one capsule type semiconductor package 10 (i.e. upper one) are connected to lead terminals 32 of the lead frame 31 via bonding wires 37a. The electrodes 13 on the rear surface of the interposer substrate 11 of the other capsule type semiconductor package 10 (i.e. lower one) are connected to the lead terminals 32 of the lead frame 31 via bonding wires 37b. Then, the two capsule type semiconductor packages 10 and the bonding wires 37a and 37b are sealed to the lead frame 31 using a sealing resin 38.

As described above, when the capsule type semiconductor packages 10 are mounted on both sides of the lead frame 31 in order to increase the memory capacity, corresponding bonding wires for data pins and address pins, for example, of the two capsule type semiconductor packages 10 can be easily led to the positions of corresponding common leads.

Furthermore, it is preferable that, on the rear surface of the interposer substrate 11 of the capsule type semiconductor package 10, the electrodes 13 be arranged in an area in which the capsule sealing resin 18 is to be formed on the opposite side. This is because, when the electrodes 13 are arranged in the area in which the capsule sealing resin 18 is formed, rigidity of the electrodes on the rear surface can be obtained, and the bonding of wires and electrodes may be better ensured for wire bonding.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-030853, filed on Feb. 7, 2005 including specification, claims, drawings and summary, on which the Convention priority of the present application is based, are incorporated herein by reference in its entirety.

What is claimed is:

1. A semiconductor device comprising:

a capsule type semiconductor package including:

an interposer substrate having electrodes on a first primary surface and a second primary surface opposing to one another, and also having desired internal electrical connections provided among the electrodes of said both primary surfaces, and a first semiconductor chip having electrodes formed on a front surface thereof and being provided over the first primary surface of the interposer substrate, first bonding wires connecting the electrodes of the first semiconductor chip to the electrodes on the first primary surface of the interposer substrate, and a first resin sealing the first semiconductor chip and the first bonding wires to the first primary surface of the interposer substrate, the first resin having an upper surface parallel to a first primary surface of a main substrate and being in a higher position than the front surface of the first semiconductor chip with respect to the first primary surface of the interposer substrate;

a second semiconductor chip having electrodes on a front surface thereof and being provided over the capsule type semiconductor package, the main substrate having electrodes provided on the first primary surface and a second primary surface opposing to each other, and having desired internal electrical connections among the electrodes of said both primary surfaces, the capsule type semiconductor package being so disposed between the main substrate and the second semiconductor chip to electrically connect to a first group of the electrodes on the first primary surface of the main substrate, second bonding wires connecting the electrodes of the second semiconductor chip to a second group of the electrodes on the first primary surface of the main substrate; and a second resin sealing the capsule type semiconductor package, the second semiconductor chip and the second bonding wire to the first primary surface of the main substrate, the second resin having an upper surface in a higher position than the front surface of the second semiconductor chip with respect to the first primary surface of the main substrate, wherein the second semiconductor chip is an uppermost semiconductor chip spaced from the main substrate in the second resin, wherein a distance from a top position of the second bonding wires, which is the farthest position from the first primary surface of the main substrate in a direction vertical to the first primary surface of the main substrate, to the upper surface of the second resin is larger than a distance from a top position of the first bonding wires, which is the farthest position from the first primary surface of the interposer substrate in a direction vertical to the first primary surface of the interposer substrate, to the upper surface of the first resin, wherein the width of the first resin as seen in a cross-sectional view is smaller than a width of the interposer substrate, wherein a plurality of second electrodes are formed around the first resin on the first primary surface of the interposer substrate, and third bonding wires connect the electrodes of the second semiconductor chip to the second electrodes on the first primary surface of the interposer substrate.

2. The semiconductor device according to claim 1, wherein the capsule type semiconductor package is so provided that the second primary surface of the interposer substrate is faced opposite to the first primary surface of the main substrate, and the upper surface of the first resin is faced opposite to the second semiconductor chip.

3. The semiconductor device according to claim 2, further comprising a bonding member bonding the electrodes on the second primary surface of the interposer substrate to the first group of the electrodes on the first primary surface of the main substrate, wherein the electrodes on the second primary surface of the interposer substrate are faced opposite to the first group of the electrodes respectively.

4. The semiconductor device according to claim 3, wherein the bonding member includes solder.

5. The semiconductor device according to claim 1, wherein the first semiconductor chip is a memory chip and the second semiconductor chip is a logic chip.

6. The semiconductor device according to claim 5, wherein the logic chip has memory cells whose number is smaller than that of memory cells included in the memory chip.

7. A semiconductor device comprising:

a capsule type semiconductor package including:

an interposer substrate having electrodes on a first primary surface and a second primary surface opposing to one another, and also having desired internal electrical connections provided among the electrodes of said both primary surfaces, and a first semiconductor chip having electrodes formed on a front surface thereof and being provided over the first primary surface of the interposer substrate, first bonding wires connecting the electrodes of the first semiconductor chip to the electrodes on the first primary surface of the interposer substrate, and a first resin sealing the first semiconductor chip and the first bonding wires to the first primary surface of the interposer substrate, the first resin having an upper surface parallel to a first primary surface of a main substrate and being in a higher position than the front surface of the first semiconductor chip with respect to the first primary surface of the interposer substrate;

a second semiconductor chip having electrodes on a front surface thereof and being provided over the capsule type semiconductor package, the main substrate having electrodes provided on the first primary surface and a second primary surface opposing to each other, and having desired internal electrical connections among the electrodes of said both primary surfaces, the capsule type semiconductor package being so disposed between the main substrate and the second semiconductor chip to electrically connect to a first group of the electrodes on the first primary surface of the main substrate, second bonding wires connecting the electrodes of the second semiconductor chip to a second group of the electrodes on the first primary surface of the main substrate; and a second resin sealing the capsule type semiconductor package, the second semiconductor chip and the second bonding wire to the first primary surface of the main substrate, the second resin having an upper surface in a higher position than the front surface of the second semiconductor chip with respect to the first primary surface of the main substrate, wherein the second semiconductor chip is an uppermost semiconductor chip spaced from the main substrate in the second resin, wherein a distance from a top position of the second bonding wires, which is the farthest position from the first primary surface of the main substrate in a direction vertical to the first primary surface of the main substrate, to the upper surface of the second resin is larger than a distance from a top position of the first bonding wires, which is the farthest position from the first primary surface of the interposer substrate in a direction vertical to the first primary surface of the interposer substrate, to the upper surface of the first resin, third bonding wires connecting the second semiconductor chip to the electrodes of the second primary surface of the interposer substrate, and fourth bonding wires connecting the electrodes of the second primary surface of the interposer substrate to the first group of electrodes on the first primary surface of the main substrate.

8. The semiconductor device according to claim 7, wherein the capsule type semiconductor package is so provided that the upper surface of the first resin is faced opposite to the first primary surface of the main substrate, and the second primary surface of the interposer substrate is faced opposite to the second semiconductor chip.

9. The semiconductor device according to claim 7, further comprising third bonding wires connecting the electrodes on the second primary surface of the interposer substrate to the first group of the electrodes on the first primary surface of the main substrate, wherein a top position of the third bonding wires, which is the farthest position from the first primary surface of the main substrate in a direction vertical to the first primary surface of the main substrate, is in a lower position than the top position of the second bonding wires.

* * * * *